(12) United States Patent
Smith

(10) Patent No.: US 6,980,477 B2  
(45) Date of Patent: Dec. 27, 2005

(54) CHOPPER SENSOR FOR MRAM

(75) Inventor: Kenneth K. Smith, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 326 days.

(21) Appl. No.: 10/314,111

(22) Filed: Dec. 7, 2002

(65) Prior Publication Data

US 2004/0109345 A1    Jun. 10, 2004

(51) Int. Cl.$^7$ ................................................. G11C 7/00
(52) U.S. Cl. .................. 365/205; 365/206; 365/225.5
(58) Field of Search ............................... 365/205, 206, 365/213, 225.5, 158

(56) References Cited

U.S. PATENT DOCUMENTS

| | | | |
|---|---|---|---|
| 3,609,499 A | 9/1971 | Scheerer | 318/684 |
| 3,968,420 A | 7/1976 | Yoshida | 321/45 C |
| 4,545,006 A | 10/1985 | Vitins | 363/124 |
| 6,327,164 B1 | 12/2001 | Shinkawa | 363/124 |
| 6,597,600 B2 * | 7/2003 | Baker | 365/158 |
| 6,678,197 B1 * | 1/2004 | Perner et al. | 365/206 |
| 6,826,102 B2 * | 11/2004 | Baker | 365/207 |
| 6,829,188 B2 * | 12/2004 | Baker | 365/205 |

* cited by examiner

Primary Examiner—Richard Elms  
Assistant Examiner—Toan Le (57) ABSTRACT

A sensor for a magnetic random-access memory (MRAM) of an embodiment of the invention includes an amplifier having at least two inputs and at least two outputs. The inputs are coupled to a magnetic storage element of the MRAM having a resistance corresponding to a value stored thereby and the outputs provide an output voltage corresponding to the resistance of the magnetic storage element. The sensor comprises a chopper switch coupled between one input of the amplifier and the magnetic storage element, a chopper switch coupled between another input of the amplifier and the magnetic storage element, and a chopper switch coupled between the outputs of the amplifier.

23 Claims, 6 Drawing Sheets

CHOPPER SENSOR FOR MRAM

BACKGROUND OF THE INVENTION

Magnetic random-access memory (MRAM) is a non-volatile memory for long-term data storage. A typical MRAM device includes an array of memory cells. Word lines extend along rows of the memory cells, and bit lines extend along columns of the memory cells. Each memory cell is thus located at a cross point of a word line and a bit line. The memory cell stores a bit of information as an orientation of a magnetization. The magnetization of each memory cell may have one of two stable orientations at any given time, parallel and anti-parallel, which correspond to logical values of zero and one.

To read the value stored at a desired memory cell, the appropriate word and bit lines are biased relative to one another, and the current through the cell is determined. Because the resistance of the memory cell is dependent on its magnetic orientation, the current measured is likewise dependent on the magnetic orientation of the memory cell.

SUMMARY OF THE INVENTION

A sensor for a magnetic random-access memory (MRAM) of an embodiment of the invention comprises an amplifier having at least two inputs and at least two outputs. The inputs are coupled to a magnetic storage element of the MRAM having a resistance corresponding to a value stored thereby and the outputs provide an output voltage corresponding to the resistance of the magnetic storage element. The sensor comprises a chopper switch coupled between one input of the amplifier and the magnetic storage element, a chopper switch coupled between another input of the amplifier and the magnetic storage element, and a chopper switch coupled between the outputs of the amplifier.

BRIEF DESCRIPTION OF THE DRAWINGS

The drawings referenced herein form a part of the specification. Features shown in the drawing are meant as illustrative of only some embodiments of the invention, unless otherwise explicitly indicated.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced.

Figure 1:
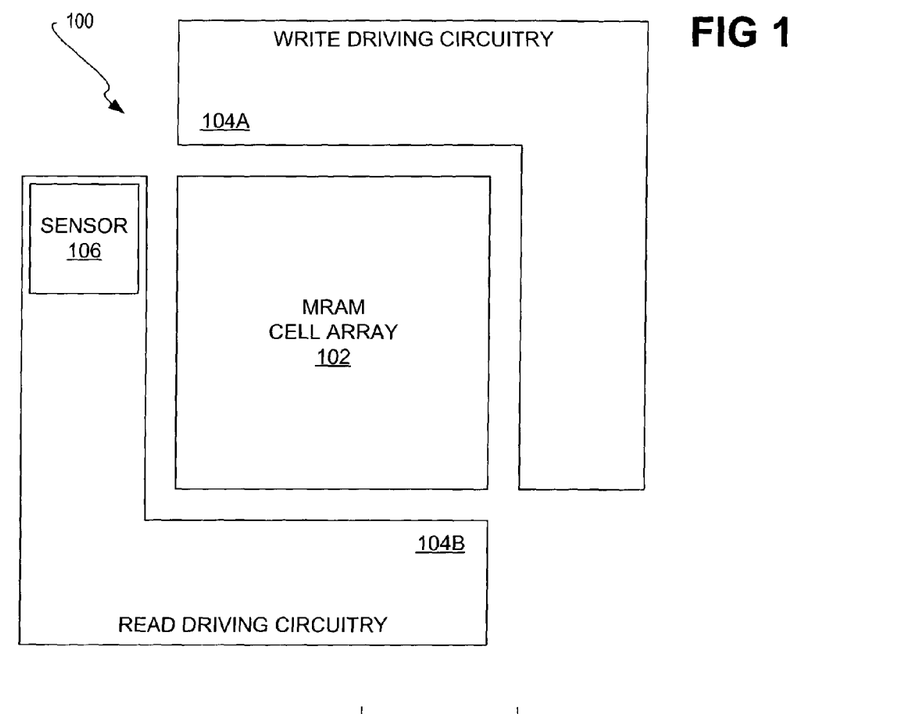
FIG. 1 is a diagram of a magnetic random-access memory (MRAM) device, in accordance with which embodiments of the invention may be implemented.

FIG. 1 shows a representative magnetic random-access memory (MRAM) storage device 100, in accordance with which embodiments of the invention can be implemented. The MRAM storage device 100 includes an MRAM cell array 102, where each MRAM cell is able to switchably store one of a number of different logical values. Each MRAM cell may, in one embodiment, be a spin-dependent tunneling (SDT) device. For instance, each MRAM cell may have a first magnetic orientation, known as the parallel orientation, corresponding to a first logical value stored by the cell, such as logical zero. Each MRAM cell may also have a second magnetic orientation, known as the anti-parallel orientation, corresponding to a second logical value stored by the cell, such as logical one.

The MRAM storage device 100 further includes write driving circuitry 104A and read driving circuitry 104B. The write driving circuitry 104A and read driving circuitry 104B are collectively referred to as the driving circuitry 104. The driving circuitry 104 enables the selective writing of logical values to, and the selective reading of logical values from, MRAM cell array 102. Specifically, the write driving circuitry 104A provides for the selective writing of logical values to the MRAM cell array 102, whereas the read driving circuitry 104B provides for the selective reading of logical values from the MRAM cell array 102. The read driving circuitry 104B includes a sensor 106 that determines, or measures, the voltage at a selected MRAM cell of the array 102, so that the voltage can be correlated with the logical value currently stored by the cell.

Figure 2:
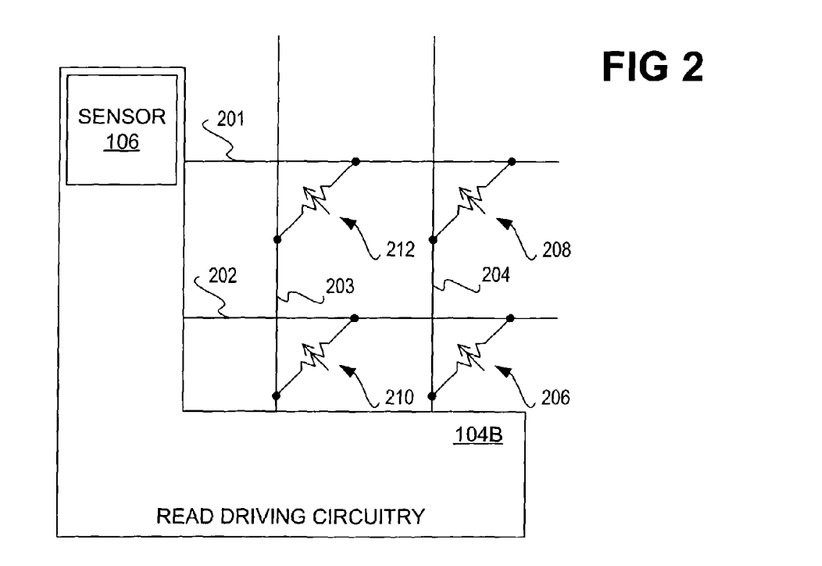
FIG. 2 is a diagram of the MRAM device of FIG. 1 in more detail with respect to a partial array of MRAM cells, according to an embodiment of the invention.

FIG. 2 illustrates the MRAM device 100 in more detail as it relates to a partial array of MRAM cells made up of the magnetic storage elements 206, 208, 210, and 212, according to an embodiment of the invention. Word read lines 201 and 202 extend horizontally in the drawing, coupling the magnetic storage elements 208 and 212, and the elements 206 and 210, respectively. Bit read lines 203 and 204 extend vertically in the drawing, coupling the magnetic storage elements 210 and 212, and the elements 206 and 208, respectively. The read driving circuitry 104B is coupled to the word read lines 201 and 202 and the bit read lines 203 and 204 as well.

Each of the magnetic storage elements 206, 208, 210, and 212 is represented as an active resistor, which has a resistance corresponding to the magnetic orientation thereof, and thus to the logical value currently stored thereby.

Reading one of the magnetic storage elements 206, 208, 210, and 212 is accomplished as follows. For explanatory purposes only, the discussion is presented with respect to reading the logical value stored in the magnetic storage element 206. The word read line 202 that is coupled to the magnetic storage element 206 is tied to ground, whereas the bit read line 204 that is coupled to the magnetic storage element 206 is asserted at a voltage by an amplifier. The sensor 106 then effectively determines the resistance of the magnetic storage element 206 by, for instance, effectively determining the current that passes through the element 206, and outputting a corresponding voltage discharge.

The current through the element 206 is initially sourced by a voltage supply, which also charges a capacitor. The voltage supply and the capacitor are not specifically depicted in FIG. 2, but are depicted in FIG. 6C as the voltage 574 and the capacitor 580, respectively, as is described in more detail later herein. While connected to the voltage supply, the element 206 has a voltage across it that is held constant, and the voltage on the capacitor is correspondingly set equal to that of the voltage supply. The voltage supply is then turned off, and the capacitor sources current to the element 206. As current is drawn from the capacitor, its voltage decreases from its initial state at a rate proportional to the current through the storage element 206. The voltage output by the sensor 106 correspondingly decreases. The rate at which the current through the element 206 and the voltage output by the sensor 106 decrease depends on the resistance of the element 206, and hence on the logical value stored thereby.

Figure 3:
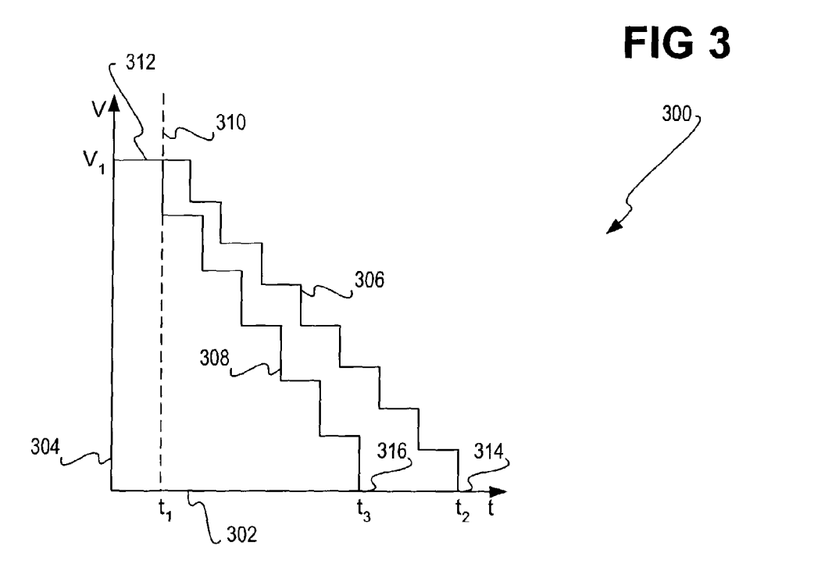
FIG. 3 is a graph showing the chopping noise that embodiments of the invention at least substantially reduce.

FIG. 3 shows a graph 300 of the drop in the voltage output by the sensor 106 over time until the voltage reaches zero, in an uneven manner that is substantially eliminated or at least substantially reduced by embodiments of the invention. As used herein, the terms eliminate and reduce are inclusive of substantial elimination and substantial reduction, respectively. The graph 300 measures voltage on the y-axis 304 as a function of time on the x-axis 302. Until the time $t_1$, as indicated by the dotted line 310, the voltage is constant at the level $V_1$, as represented by the line 312, due to the voltage supply being turned on. At the time $t_1$, the voltage source is turned off.

When the magnetic storage element 206 has a first resistance, due to a first magnetic orientation thereof representing a first logical value stored thereby, the voltage on the capacitor drops in accordance with the uneven line 306. When the magnetic storage element 206 has a second resistance less than the first resistance, due to a second magnetic orientation thereof representing a second logical value stored thereby, the voltage drops in accordance with the uneven line 308. Thus, the voltage drops to a level represented by the x-axis 302 at different times, depending on the magnetic orientation of the storage element 206.

That is, when the magnetic storage element 206 has a first resistance, such that the voltage drops in accordance with the uneven line 306, the voltage drops to the level represented by the x-axis 302 at a time $t_2$, as indicated by the reference number 314. When the magnetic storage element 206 has a second resistance, such that the voltage drops in accordance with the uneven line 308, the voltage drops to the level represented by the x-axis 302 at a time $t_3$, as indicated by the reference number 316. Therefore, based on the time it takes for the sensor 106 to measure the voltage represented by the x-axis 302, the read driving circuitry 104B is able to determine the resistance of the magnetic storage element 206, and hence the logical value stored by the magnetic storage element 206.

However, the noise represented by the lines 306 and 308 can cause difficulty when determining the resistance of the magnetic storage element 206, and hence when determining the logical value stored by the magnetic storage element 206. The uneven nature of the lines 306 and 308 is unpredictable, such that the length of time it takes for the voltage to reach the level represented by the x-axis 302 may be difficult to utilize to consistently and accurately determine the logical value currently stored by the magnetic storage element 206. The implementation of the embodiment of the sensor 106 described in the subsequent sections of the detailed description substantially eliminate, or at least substantially reduce, the uneven nature of the lines 306 and 308 depicted in FIG. 3, to alleviate the difficulty in determining the logical value stored by the magnetic storage element 206.

The uneven noise of the lines 306 and 308 may result from different sources, including flicker noise inherent in transistors, and so on. The uneven noise also results from sneak resistance, as is described in detail later herein. Furthermore, as can be appreciated by those of ordinary skill within the art, the uneven noise of the lines 306 and 308 as shown in FIG. 3 is for exemplary purposes only, and the actual type of uneven noise present on the lines 306 and 308 may differ than that shown in FIG. 3. For instance, the noise may be a sinusoidal wave superimposed on decreasing-slope lines. Such a sinusoidal wave may have its frequency changing, increasing and/or decreasing, over time as well. The uneven noise is typically low-frequency noise, and may be generally referred to as "flicker" noise.

Figure 4:
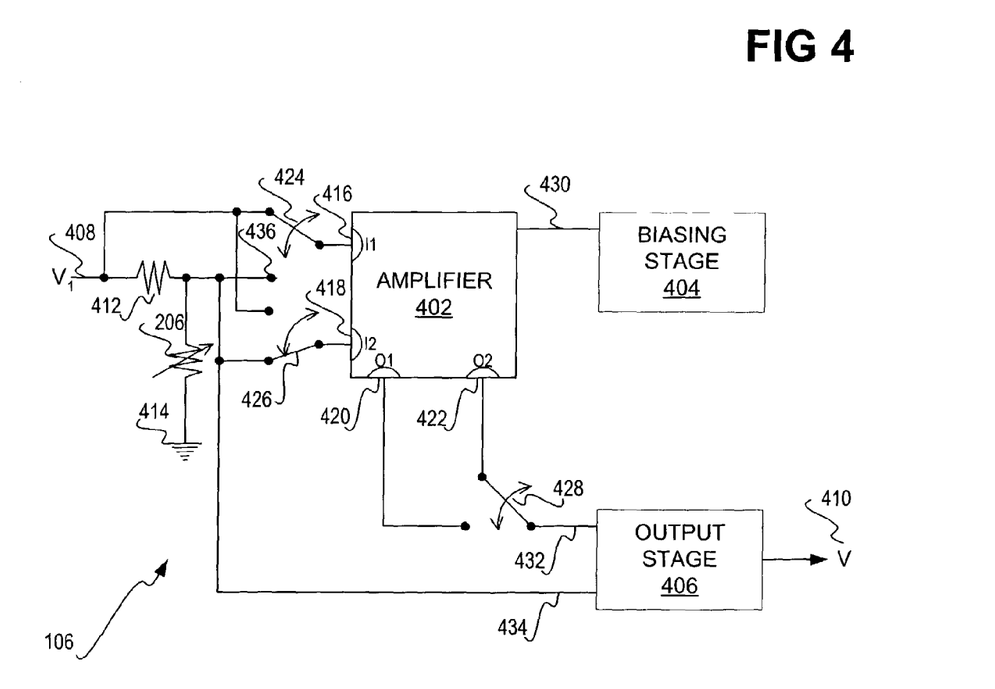
FIG. 4 is a diagram of the sensor of the MRAM device of FIGS. 1 and 2, according to an embodiment of the invention.

FIG. 4 shows the sensor 106 of the magnetic random-access memory (MRAM) storage device 100 of FIGS. 1 and 2 in detail, according to an embodiment of the invention. The sensor 106 includes an amplifier 402, a biasing stage 404 for the amplifier 402, and an output stage 406 for the amplifier 402. The voltage V, 408 represents the initial voltage at which the magnetic storage element 206 is biased—which is the magnetic storage element 206 whose logical value is being determined—through to ground 414, and the voltage V 410 is the output voltage of the sensor 106, which in one embodiment is the voltage over the capacitor 580 of FIG. 6C, as will be described.

A sneak resistance 412 is present. The sneak resistance 412 encompasses the resistances of other of the magnetic storage elements on the same bit read line as the magnetic storage element 206 whose logical value is being determined. For instance, in FIG. 2, the sneak resistance 412 is the resistance of the magnetic storage element 208, since it is coupled to the same bit read line 204 as is the magnetic storage element 206. More specifically, the sneak resistance 412 is equal to the parallel combination of the other magnetic storage elements on the same bit read line as the magnetic storage element 206 whose logical value is being determined.

Referring again to FIG. 4, the biasing stage 404 is coupled to the amplifier 402 as indicated by the line 430. The amplifier has a first input 416, a second input 418, a first output 420, and a second output 422. A first chopper switch 424 is coupled to the first input 416, and oscillates between the applied voltage $V_1$ 408 and the point 436 as shown in FIG. 4. Similarly, a second chopper switch 426 is coupled to the second input 418, and oscillates between the applied voltage $V_1$ 408 and the point 436 as shown in FIG. 4. The outputs 420 and 422 are oscillated between by a third chopper switch 428 that is coupled to an input 432 of the output stage 406, where another input 434 of the output stage 406 is coupled to the point 436 as shown in FIG. 4.

The chopper switches 424, 426, and 428 preferably oscillate between their respective points depicted in FIG. 4 in unison, at a frequency that is twice the frequency of the uneven noise of the lines 306 and 308 of FIG. 3. That is, the switches 424, 426, and 428 "chop" between their respective points depicted in FIG. 4. The oscillating chopper switches 424, 426, and 428 are collectively referred to as an oscillating chopper mechanism. The oscillating chopping nature of the switches 424, 426, and 428 substantially eliminates, or at least substantially reduces, the frequency of the uneven noise of the lines 306 and 308 of FIG. 3. Thus, the oscillating chopper mechanism regulates the voltage provided at the outputs 420 and 422 of the amplifier 402 that corresponds to the resistance of the magnetic storage element 206. That is, the oscillating chopper mechanism substantially prevents the sneak resistance 412 from affecting the voltage provided at the outputs 420 and 422.

Figure 5:
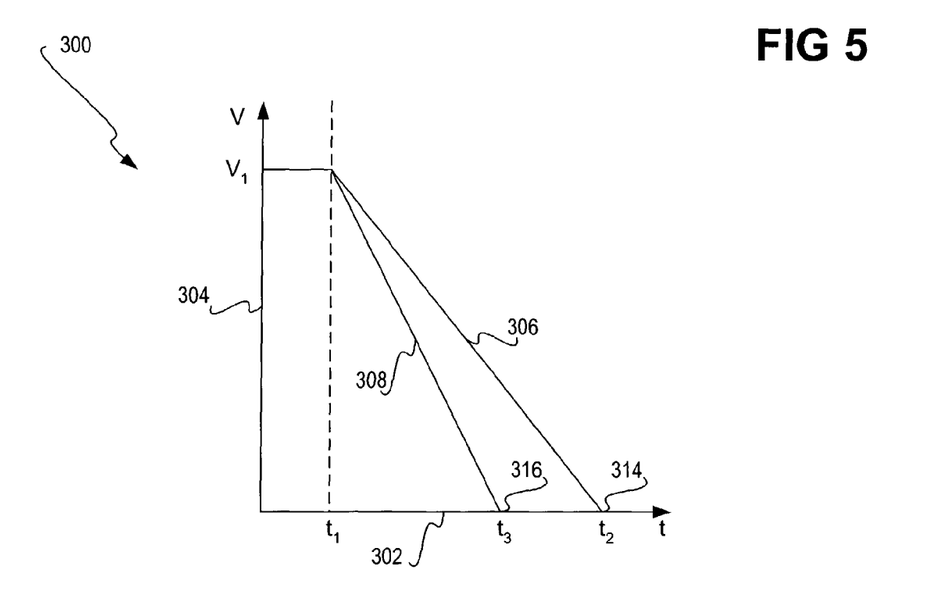
FIG. 5 is a graph showing the effect of the sensor of FIG. 4 on the chopping noise of FIG. 3, according to an embodiment of the invention.

FIG. 5 shows the graph 300 of FIG. 3 resulting from an embodiment of the invention in which the sensor 106 of FIG. 4 is utilized to measure the voltage V 410, which in one embodiment is the voltage over the capacitor 580 of FIG. 6C, as will be described. The graph 300 measures the voltage V 410 on the y-axis 304 as a function of time on the x-axis 302, where the voltage starts at a voltage $V_1$, as represented by the line 312, until time $t_1$, as represented by the dotted line $t_1$, due to the voltage on the word read line 202 having been removed. The lines 306 and 308 in FIG. 5 no longer have an uneven nature, as they are depicted as having in FIG. 3, due to embodiments of the oscillating chopping mechanism such as is depicted in FIG. 4. Thus, the times $t_2$ and $t_3$, as pointed to by the reference numbers 314 and 316, respectively, are less likely to fluctuate due to noise. Note that the lines 306 and 308 in FIG. 5 depict the ideal scenario in which the uneven noise is completely eliminated. However, in actuality, there may be some noise remaining in the lines 306 and 308, albeit substantially reduced as compared to the uneven noise in the lines 306 and 308 in FIG. 3.

Figure 6A:
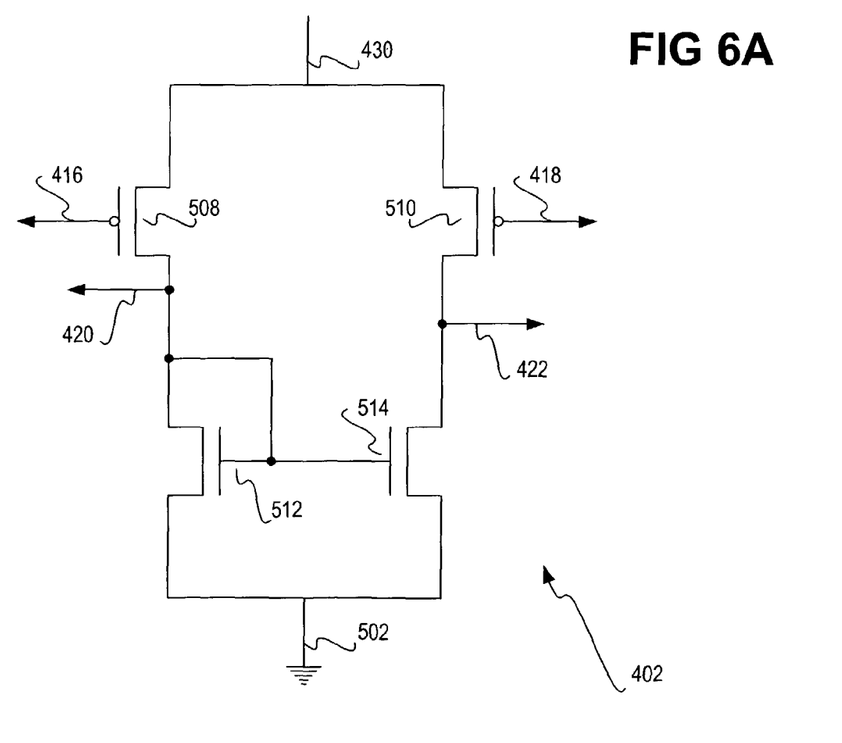
FIG. 6A is a diagram of one implementation of the amplifier of the sensor of FIG. 4, according to an embodiment of the invention.
Figure 6B:
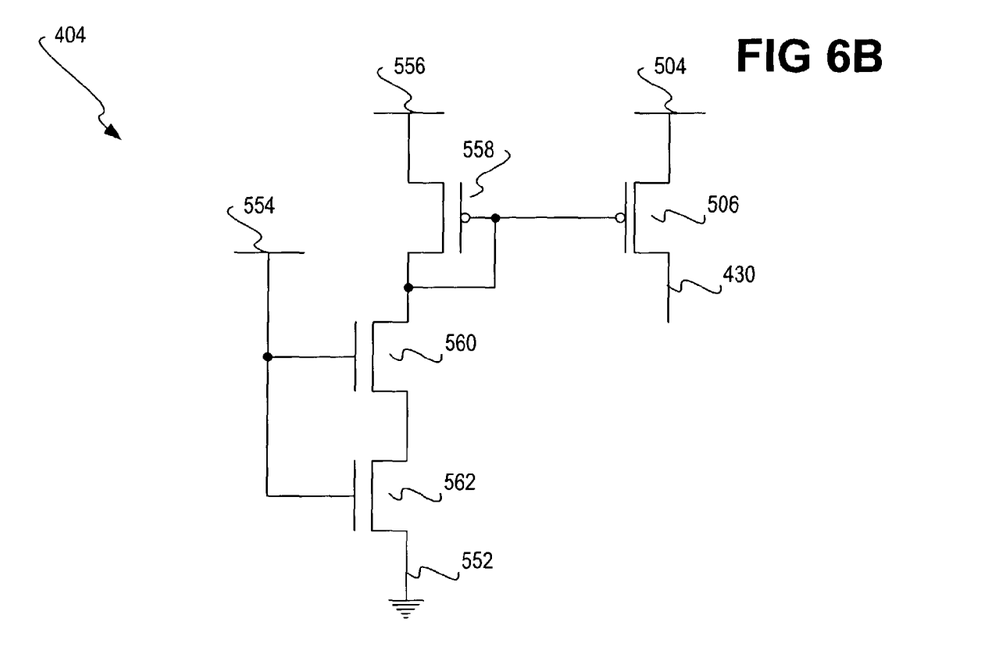
FIG. 6B is a diagram of one implementation of the biasing stage of the sensor of FIG. 4, according to an embodiment of the invention.
Figure 6C:
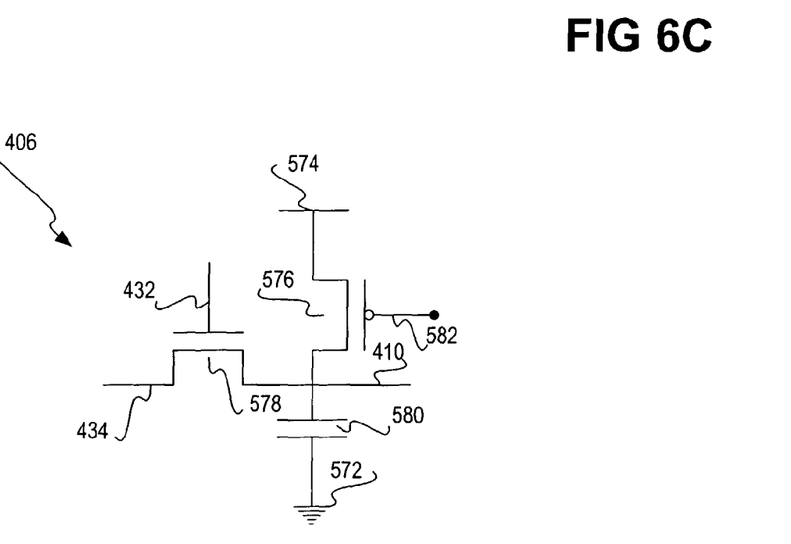
FIG. 6C is a diagram of one implementation of the output stage of the sensor of FIG. 4, according to an embodiment of the invention.

FIGS. 6A, 6B, and 6C show particular implementations of the amplifier 402, the biasing stage 404, and the output stage 406, respectively, of the sensor 106 of FIG. 4, according to an embodiment of the invention. In FIG. 6A, the amplifier 402 is implemented as a complementary metal-oxide semiconductor (CMOS) operational amplifier. The biasing provided by the biasing stage 404 of FIG. 4, input at the line 430, supplies the differential pair of transistors 508 and 510 with bias current. This pair of transistors 508 and 510 is the input differential transistor pair, since the inputs 416 and 418, respectively, are coupled thereto. The differential pair is actively loaded with a current mirror formed by transistors 512 and 514, which are connected to ground 502. The outputs 420 and 422 are illustrated above the transistors 512 and 514. The amplifier 402 may be implemented in other manners besides that indicated in FIG. 6A, however.

In FIG. 6B, the biasing stage 404 is implemented as a pair of transistors 506 and 558 that act as a current mirror, with the voltage 504 biasing the transistor 506, and the voltage 556 biasing the transistor 558. A current source for this current mirror is formed by the transistors 560 and 562, their inputs being coupled to the voltage 554, and the transistor 562 leading to ground. The output of the biasing stage 404 extends from the transistor 506, as indicated by the line 430. The biasing stage 404 may be implemented in other manners besides that indicated in FIG. 6B, however.

In FIG. 6C, the output stage 406 is implemented as the transistor 578, which is actively loaded with the current-source transistor 576. The transistor 578 is coupled to the inputs 432 and 434 of the output stage 406 as shown in FIG. 6C, whereas the transistor 576 is biased with a voltage 574. The transistor is initially turned on by grounding the point 582, and then is turned off by asserting the point 582 at a given voltage level. The capacitor 580 is thus initially charged to the voltage present at the input 434. The voltage over the capacitor 580, from the voltage 410 to ground 572, subsequently decreases at a rate that depends on the resistance of the magnetic storage element 206 (not shown in FIG. 6C) whose logical value is being determined. It is noted that the output stage 406 may be implemented in other manners besides that indicated in FIG. 6C. Thus, the voltage 410 depicted in FIG. 5 is the voltage over the capacitor 580.

Figure 7A:
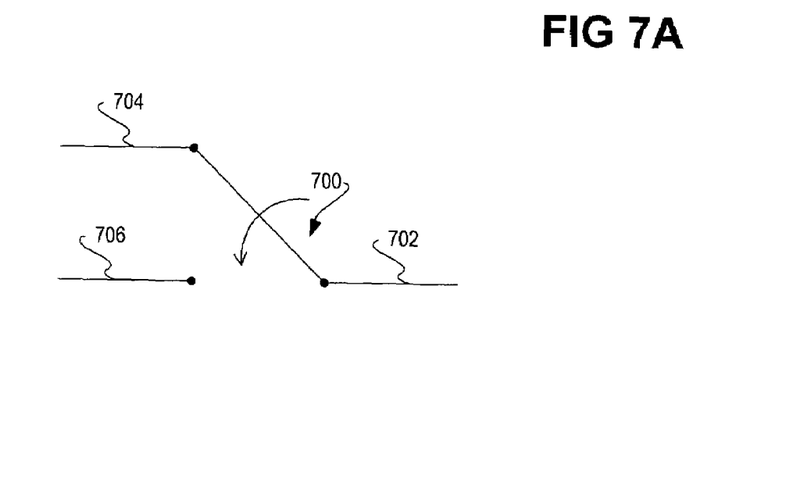
FIGS. 7A and 7B are diagrams of a chopper switch that may be used to implement each of the chopper switches of FIG. 4, in one embodiment of the invention.
Figure 7B:
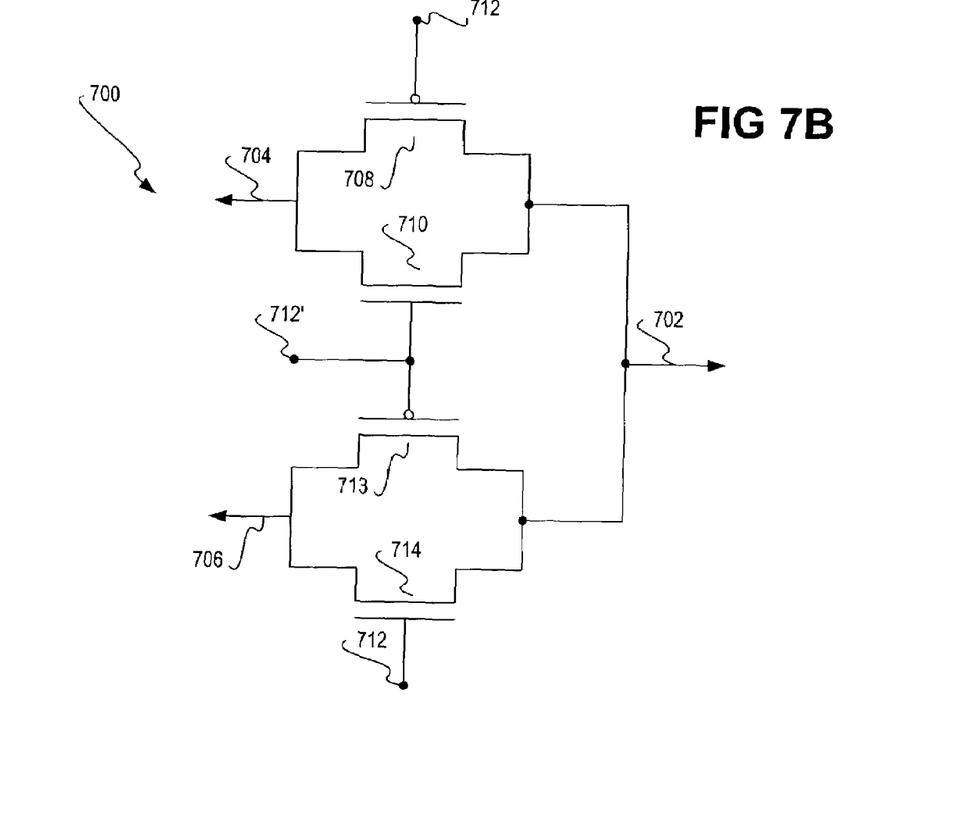

FIGS. 7A and 7B show a chopper switch 700 that may be used to implement each of the chopper switches 424, 426, and 428 of FIG. 4, according to one embodiment of the invention. The chopper switches 424, 426, and 428 of FIG. 4 may be implemented in other manners besides as the chopper switch 700 of FIGS. 7A and 7B, however. FIG. 7A shows the chopper switch 700 chopping between the inputs 704 and 706, providing the output 702, whereas FIG. 7B shows how the chopper switch 700 may be implemented with CMOS transistors 708, 710, 713, and 714.

In FIG. 7B, the input to each of the transistors 708 and 714 is coupled to a voltage 712 that outputs a square wave oscillating between a turn-on voltage and a turn-off voltage at a frequency twice that of the uneven noise that is to be substantially eliminated or at least substantially reduced. The input to each of the transistors 710 and 713 is the opposite of the voltage 712, and is indicated as the voltage 712'. That is, when the voltage 712 is high, or outputting a turn-on voltage, the voltage 712' is low, or outputting a turn-off voltage, and vice-versa. When the voltage 712 is outputting the turn-on voltage, the transistors 713 and 714 are on, and the transistors 708 and 710 are off, such that the output 702 is equal to the input 706. When the voltage 712 is outputting the turn-off voltage, such as zero volts, the transistors 713 and 714 are off, and the transistors 708 and 710 are on, such that the output 702 is equal to the input 704. Thus, the output 702 oscillates between the inputs 704 and 706.

Figure 8:
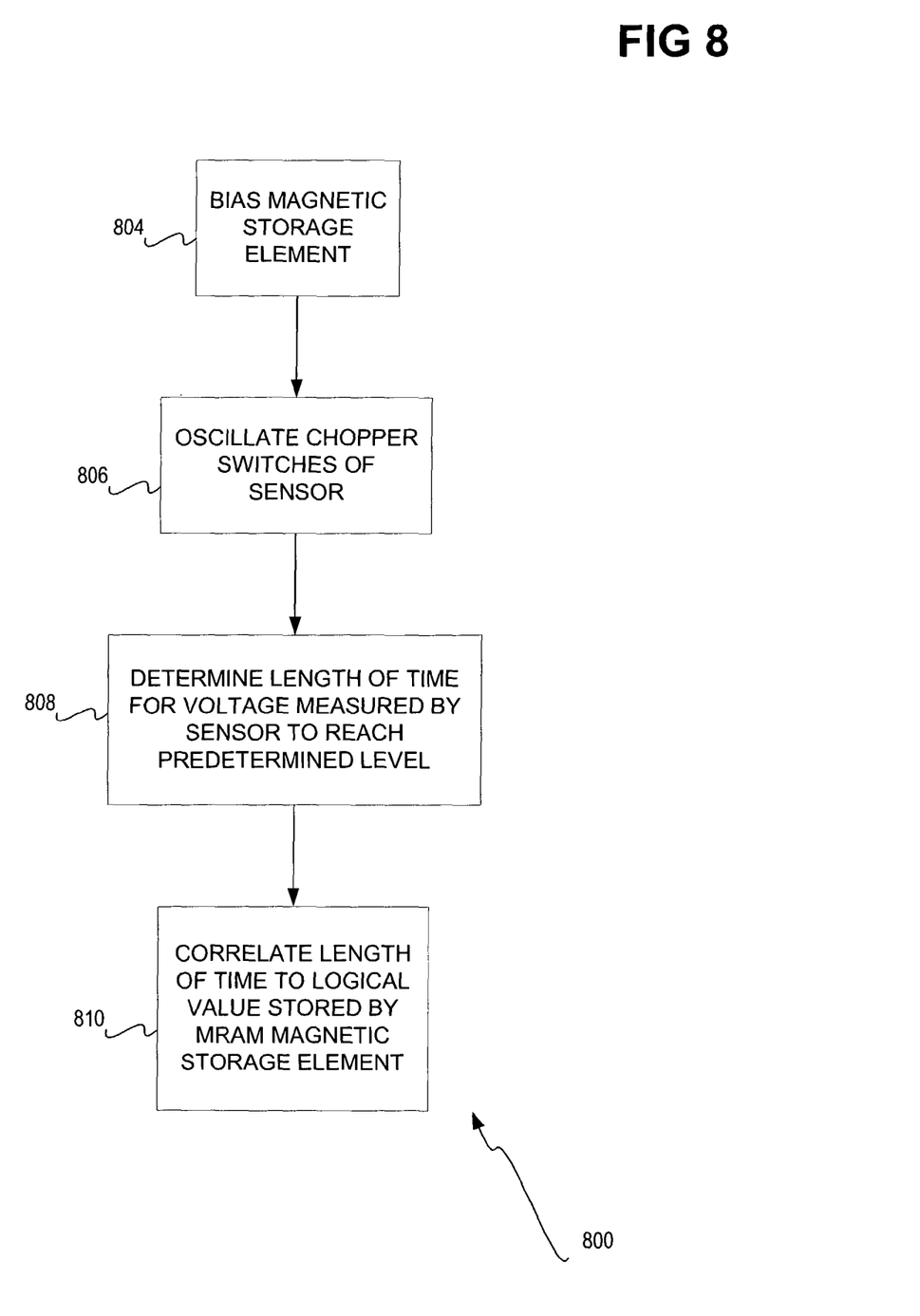
FIG. 8 is a flowchart of a method for reading the logical value stored by an MRAM cell, according to an embodiment of the invention.

FIG. 8 shows a method 800 for determining the logical value stored by the magnetic storage element of a desired magnetic random-access memory (MRAM) cell, according to an embodiment of the invention. The method 800 can be performed by the read driving circuitry 104B of FIGS. 1 and 2, including the sensor 106 thereof, in one embodiment. The magnetic storage element is biased, utilizing a word line and a bit line that are coupled to the element (804). For instance, the word line can be biased, whereas the bit line can be grounded. The chopper switches of the sensor are then oscillated as has been described (806), to regulate the voltage output by the sensor.

The resistance of the magnetic storage element of the MRAM cell corresponds to the logical value stored by the MRAM cell, such that the length of time for the voltage at the output of the sensor to decrease to a predetermined level is based on this resistance, as has been described. Therefore, the length of time for the voltage at the output of the sensor to drop to the predetermined level is determined, or measured (808), and this length of time is correlated to the logical value stored in the magnetic storage element of the MRAM cell (810). For instance, a length of time of a first value may correspond to a logical zero being stored by the MRAM cell, whereas a length of time of a second value may correspond to a logical one being stored by the MRAM cell. In this way, the method 800 reads the logical value stored by the MRAM cell.

I claim:

1. A sensor for a magnetic random-access memory (MRAM) comprising:
    an amplifier having at least two inputs and at least two outputs, the inputs coupled to a magnetic storage element of the MRAM having a resistance corresponding to a value stored thereby, the outputs providing an output voltage corresponding to the resistance of the magnetic storage element;
a first chopper switch coupled between one input of the amplifier and the magnetic storage element;
a second chopper switch coupled between another input of the amplifier and the magnetic storage element; and,
a third chopper switch coupled between the outputs of the amplifier,
wherein each of at least one of the first and second chopper switches comprises four transistors.

2. The sensor of claim 1, further comprising a biasing stage for the amplifier.

3. The sensor of claim 1, further comprising an output stage for the amplifier.

4. The sensor of claim 1, wherein each of the at least two inputs has further effectively coupled thereto a sneak resistance.

5. The sensor of claim 1, wherein the chopper switches operate to eliminate noise at a first frequency at an output of the sensor.

6. The sensor of claim 1, wherein the amplifier comprises an operational amplifier.

7. A sensor for a magnetic random-access memory (MRAM) comprising:
an amplifier having at least two inputs and at least two outputs, the inputs coupled to a magnetic storage element of the MRAM having a resistance corresponding to a value stored thereby, the outputs providing an output voltage corresponding to the resistance of the magnetic storage element;
a chopper switch coupled between one input of the amplifier and the magnetic storage element;
a chopper switch coupled between another input of the amplifier and the magnetic storage element; and,
a chopper switch coupled between the outputs of the amplifier,
wherein the switches operate to eliminate noise at a first frequency at an output of the sensor, and oscillate in unison at a second frequency equal to two times the first frequency.

8. A sensor for a magnetic random-access memory (MRAM) comprising:
an amplifier coupled to a magnetic storage element of the MRAM having a resistance corresponding to a value stored by the magnetic storage element; and,
an oscillating chopper mechanism to regulate an output voltage of the sensor corresponding to the resistance of the magnetic storage element,
wherein the oscillating chopper mechanism comprises an oscillating chopper switch at each of a first input and a second input of the amplifier oscillating in unison at a frequency equal to twice a frequency of noise reduced by the oscillating chopper mechanism.

9. The sensor of claim 8, further comprising a biasing stage and an output stage for the amplifier.

10. The sensor of claim 8, wherein the oscillating chopper mechanism regulates the output voltage of the sensor by reducing noise resulting from a sneak resistance.

11. A sensor for a magnetic random-access memory (MRAM) comprising:
an amplifier coupled to a magnetic storage element of the MRAM having a resistance corresponding to a value stored by the magnetic storage element; and,
an oscillating chopper mechanism to regulate an output voltage of the sensor corresponding to the resistance of the magnetic storage element,
wherein the oscillating chopper mechanism comprises an oscillating chopper switch between a first output and a second output of the amplifier oscillating in at a frequency equal to twice a frequency of noise reduced by the oscillating chopper mechanism.

12. A method comprising:
biasing a magnetic random access memory (MRAM) magnetic storage element; and,
oscillably switching each of at least two inputs of a sensor with a chopper switch at each input, at least one of the chopper switches each comprising four transistors, and oscillably switching between at least two outputs of the sensor, to regulate a voltage provided by the sensor corresponding to a logical value stored by the MRAM magnetic storage element as biased.

13. The method of claim 12, further comprising:
determining a length of time for the voltage provided by the sensor to decrease to a predetermined level; and,
correlating the length of time determined with a logical value stored by the MRAM magnetic storage element.

14. The method of claim 12, wherein oscillably switching each of the at least two inputs and oscillably switching between the at least two outputs prevents a sneak resistance from affecting the voltage provided by the sensor.

15. A method comprising:
biasing a magnetic random access memory (MRAM) magnetic storage element; and,
oscillably switching each of at least two inputs of a sensor, and oscillably switching between at least two outputs of the sensor, to regulate a voltage provided by the sensor corresponding to a logical value stored by the MRAM magnetic storage element as biased,
wherein oscillably switching each of the at least two inputs and oscillably switching between the at least two outputs comprises so oscillating at a first frequency equal to two times a second frequency at which noise of the voltage provided by the sensor is desirably reduced.

16. A magnetic random-access memory (MRAM) device comprising:
a magnetic storage element storing a logical value;
an amplifier operatively coupled to the magnetic storage element by at least two inputs;
a first oscillating chopper switch operatively coupled between one input and the magnetic storage element;
a second oscillating chopper switch operatively coupled between another input and the magnetic storage element, the second oscillating chopper switch separate from the first oscillating chopper switch; and,
a third oscillating chopper switch coupled between at least two outputs of the amplifier,
wherein each of at least one of the first and second oscillating chopper switches comprises four transistors.

17. The MRAM device of claim 16, further comprising:
a biasing stage for the amplifier; and,
an output stage for the amplifier.

18. The MRAM device of claim 16, wherein each of the inputs is further coupled to a sneak resistance, the oscillating chopper switches preventing the sneak resistance from affecting a voltage provided by the sensor corresponding to a logical value stored by the magnetic storage element.

19. A magnetic random-access memory (MRAM) device comprising:
a magnetic storage element storing a logical value;
an amplifier operatively coupled to the magnetic storage element by at least two inputs;

an oscillating chopper switch operatively coupled between one input and the magnetic storage element;

an oscillating chopper switch operatively coupled between another input and the magnetic storage element; and, an oscillating chopper switch coupled between at least two outputs of the amplifier, wherein the oscillating chopper switches oscillate at a first frequency equal to two times a second frequency at which noise of a voltage provided by the sensor corresponding to a logical value stored by the magnetic storage element is desirably reduced.

20. A magnetic random-access memory (MRAM) device comprising:

an array of magnetic storage elements, each magnetic storage element storing a logical value;

driver circuitry coupled to the array of magnetic storage elements to read the logical values from and write the logical values to the array of magnetic storage elements; and, an oscillating chopper mechanism for the driver circuitry to regulate a voltage provided by the driver circuitry corresponding to the logical value of a selected magnetic storage element of the array, wherein the oscillating chopper mechanism oscillates at a frequency equal to twice a frequency of noise reduced by the oscillating chopper mechanism.

21. The MRAM device of claim 20, wherein the driver circuitry comprises an amplifier having a pair of inputs and a pair of outputs.

22. The MRAM device of claim 21, wherein the driver circuitry further comprises a biasing stage and an output stage for the amplifier.

23. The MRAM device of claim 21, wherein the oscillating chopper mechanism comprises an oscillating chopper switch at each of the pair of inputs and an oscillating chopper switch between the outputs of the driver circuitry.

* * * * *